United States Patent [19]

Tamura et al.

[11] Patent Number: 5,074,985

[45] Date of Patent: Dec. 24, 1991

[54] FILM FORMING APPARATUS

[75] Inventors: Hitoshi Tamura; Tamotsu Shimizu, both of Yokohama, Japan

[73] Assignee: Hitachi, Ltd., Tokyo, Japan

[21] Appl. No.: 592,283

[22] Filed: Oct. 3, 1990

[30] Foreign Application Priority Data

Oct. 6, 1989 [JP] Japan ................................. 1-260297

[51] Int. Cl.⁵ ...................... C23C 14/34; C23C 16/00
[52] U.S. Cl. ......................... 204/298.11; 204/298.16; 118/723
[58] Field of Search ...................... 204/298.38, 298.11, 204/298.16; 156/345; 118/50.1, 623, 723, 720; 315/111.21, 111.41, 111.71, 111.81, 111.91

[56] References Cited

U.S. PATENT DOCUMENTS

| 4,721,553 | 1/1988 | Saito et al. | 204/298.16 X |
| 4,776,918 | 10/1988 | Otsubo et al. | 156/345 |
| 4,857,809 | 8/1989 | Torri et al. | 315/111.31 |
| 4,952,273 | 8/1990 | Popov | 204/298.16 X |
| 4,970,435 | 11/1990 | Tanaka et al. | 315/111.21 |

Primary Examiner—Nam X. Nguyen
Attorney, Agent, or Firm—Antonelli, Terry, Stout & Kraus

[57] ABSTRACT

A film forming apparatus comprises of a microwave generating device and processing chamber. The processing chamber has a substrate therein, holds the pressure of atmosphere gas therein at a predetermined value, and generates plasma while introducing the microwave generated by the microwave generating device for forming a film on the substrate. The microwave is introduced in the processing chamber through a dielectric member disposed in the processing chamber. Further a shielding member is disposed in the processing chamber so as to be opposite to the dielectric member for preventing the attachment of film forming material to the dielectric member.

14 Claims, 6 Drawing Sheets ic power.

FILM FORMING APPARATUS

BACKGROUND OF THE INVENTION

The present invention relates to a plasma processing apparatus using microwave, and in particular to a plasma processing apparatus using microwave suitable for feeding stably plasma with microwave electric power.

The density of current flowing through wiring increases with progressing fineness and increasing density of LSIs, which is a problem with regard to realization of LSIs of next generation. For this reason research for forming a wiring film of high quality is in progress and the bias sputtering method is one of the methods useful for forming high quality films. The bias sputtering method is one for forming a film while irradiating a substrate, on which the film is to be formed (hereinbelow called simply substrate) with ions, by which it is possible to control the crystallinity of the film by irradiation with ions and to improve the coverage of steps by the film. However, by an actual sputtering apparatus, since the generation of the plasma and the sputtering of a target are effected simultaneously only by DC or high frequency electric power, it is difficult to control the amount of ions projected to the substrate, contrarily to the fact that the energy thereof can be easily controlled by giving the substrate a bias voltage. Therefore a sputtering film forming apparatus using microwave as a second energy source has been developed.

When microwave is used, it is possible to generate a high density plasma in a high vacuum region and to control the quantity of ions by varying the microwave electric power, independently of the DC or high frequency applied to the target. For this reason attention is paid thereto.

Heretofore an example, in which microwave is used for forming a conductive film, is proposed e.g. in JP-A-59-47728 (related to U.S. Pat. No. 4,492,620).

The prior art technique described above has a problem that film forming processing cannot be performed for a long time, because metallic material, with which the film is to be formed, is attached to the surface of the part made of dielectric material for introducing microwave (hereinbelow called window material), which hinder the transmission of the microwave.

SUMMARY OF THE INVENTION

An object of the present invention is to provide an apparatus for forming a conductive film, by which it is possible to prevent for metallic material to be attached to the surface of the part made of dielectric material for introducing microwave and to perform a stable film forming processing by giving stably plasma microwave electric power.

Another object of the present invention is to realize a film forming apparatus capable of forming a conductive film of high quality.

In order to achieve the above objects, in the film forming apparatus using microwave according to the present invention, there is disposed a shielding member for preventing for the film forming material to be attached to the surface of the window material without hindering the transmission of the microwave into the processing chamber on the processing chamber side of the window material (hereinbelow called window material surface) for holding a predetermined pressure within the processing chamber while introducing the microwave into the processing chamber.

The shielding member stated above consists of a plurality of plates, in order not to hinder the transmission of the microwave into the processing chamber, which are disposed approximately perpendicularly to the electric field of the microwave before the mounting of the shielding member and made of either metal or dielectric substance.

Further, in order to shield the window material surface against film forming particles projected straight in an arbitrary direction thereto, the shielding member stated above consists of a plurality of plates made of either metal or dielectric substance, whose extremity portion is inclined at a predetermined angle with respect to the electric field of the microwave before the mounting of the shielding member.

Still further, in order to increase further the shielding effect of the window material surface, the shielding member stated above is composed of metal plates provided with a slot antenna.

For a usual film forming apparatus using CVD, sputtering, etc. a pressure of several tenth Pa to several Pa is held in the processing chamber, in which the film forming processing is effected. In this pressure region the mean free path of gas molecules is about several mm to several cm. For this reason the mean free path of film forming particles has a same order of magnitude and in order to prevent for the film forming material to be attached to the window material surface, it is sufficient that the window material surface is shielded so that particles moving straight over several mm cannot reach directly the window material surface.

However, usually, when a shielding member is disposed in front of the window material, microwave is reflected by this member and therefore it is not possible to feed the interior of the processing chamber with microwave electric power with a high efficiency. For this reason, in order to reduce the reflection of the microwave, it is necessary to contrive the shape and the arrangement of the shielding member.

In general, the electric field is perpendicular to a metallic surface. Therefore, if a sufficiently thin metal plate is inserted in electromagnetic field of the microwave perpendicularly to the electric field of the microwave, no influences are given to the distribution of the original electric field. Utilizing this property, by disposing a metal plate on the processing chamber side of the window material approximately perpendicularly to the electric field of the microwave so as to shield the window material surface, it is possible to prevent the attachment of the film forming material to the window material surface without hindering the transmission of the processing chamber into the processing chamber. This member for the shielding may be made not of metal, but of dielectric substance. However, since the conductive film forming material is attached to the surface of the dielectric shielding member, it should be located perpendicularly to the electric field of the microwave, similarly to the case of the metallic shielding member.

Usually the density of the plasma produced by microwave is highest at the face of the microwave introducing window in contact with the processing chamber. If plasma is produced within the shielding member located on the processing chamber side of the microwave introducing window or between the shielding member and the microwave introducing window, microwave is absorbed by this plasma and thus electric power transmitted into the processing chamber is reduced. For this reason, it is desirable that the apparatus is so constructed that no plasma is produced within the shielding member and between the shielding member and the microwave introducing window. The mechanism, by which the plasma is produced by the microwave, is thought roughly as follows. Molecules of the atmosphere gas are ionized with a certain probability, although they are of extremely small quantity, and produced electrons are accelerated by the electric field of the microwave. Electrons accelerated with an energy higher than the ionization energy of atmosphere gas molecules collide with the atmosphere gas molecules to ionize them. The plasma is generated, when this process occurs in a chain reaction. Consequently, in order to suppress the generation of the plasma, it is efficient that electrons are not accelerated so strongly. For this reason the generation of the plasma can be suppressed, if adjacent plates disposed perpendicularly to the electric field as well as the microwave introducing window and the shielding member are brought close to each other so that the distance, over which electrons are accelerated, is sufficiently small.

Next, the case where the metal plates are inclined at a predetermined angle with respect to the electric field of the microwave will be explained.

In this case the window material surface can be shielded against film forming particles projected perpendicularly thereto.

Finally an example, in which a slot antenna is used, differently from the methods described previously, will be explained. As another method for reducing the reflection of the microwave by means of a shielding member there is known a method, by which the shielding member is composed of slot plates provided with a slot antenna. A slot antenna is a conductive flat plate, in which narrow slots are formed so that the microwave is reflected by these slots. Superficial current flowing on the conductive flat plate is obstructed by these slots, which gives rise to electric charge around the slots. This electric charge serves as a source, which emits microwave in the space. For this reason, the slots can emit microwave with a high efficiency towards the processing chamber side, when the slots are formed perpendicularly to the superficial current flowing due to the microwave and thus it is possible to reduce the reflection of the microwave. Since the superficial current flows in the direction perpendicular to the magnetic field of the microwave, by knowing the electromagnetic field distribution of the mechanism used for the excitation of the slot antenna, it is possible to determine the shape and the arrangement of the slots having a high efficiency. The slot antenna can be excited by using a cavity resonator or a wave guide. The electromagnetic field within a cavity resonator or a waveguide can be theoretically easily obtained, in the case where the form thereof is geometrically simple such as a cylinder, or a rectangular parallelepiped. By using a cavity resonator, an effect is obtained also so that electric power reflected by the end surface of the plasma is stored in the resonator, which is injected again in the plasma, in order to intend efficient utilization of microwave electric power. An example, in which a cavity resonator and a slot antenna are used for the plasma processing apparatus using microwave, is disclosed in JP-A-63-103088.

It is possible to prevent the attachment of film forming particles to the window material surface under slot plates by disposing more than two slot plates on the processing chamber side of the window material so that the slots are not superposed on each other.

According to the present invention it is possible to prevent the attachment of the film forming material to the surface of the dielectric part (window material) indispensable for introducing microwave into the processing chamber. According to the present invention it is possible to introduce stably microwave into the processing chamber over a long time.

By using a film forming apparatus according to the present invention it is possible to generate stably a high density plasma in a pressure region from $10^{-1}$ Pa to $10^{-2}$ Pa over a long time by microwave by introducing atmosphere gas in the processing chamber after having evacuated it to a high degree vacuum and to form conductive films of high quality. That is, since the films are formed in a low pressure atmosphere gas, the mean free path of molecules in the atmosphere gas is long, which increases straight mobility of the film forming particles and improves the step coverage by the film at the bottom portion of a step, etc. Further, since the films are formed by using a high density plasma, it is possible to feed a target with a sufficient electric power even at a low voltage. The energy of recoil gas molecules can be decreased by lowering the voltage applied to the target and it is possible to form dense films having a slight absorption of atmosphere gas molecules. Here the recoil gas molecules mean molecules neutralized and reflected by the target, when ions in the plasma collide with the target.

As explained above, by using the film forming apparatus according to the present invention it is possible to form conductive films of high quality.

DESCRIPTION OF THE PREFERRED EMBODIMENTS

Figure 1:
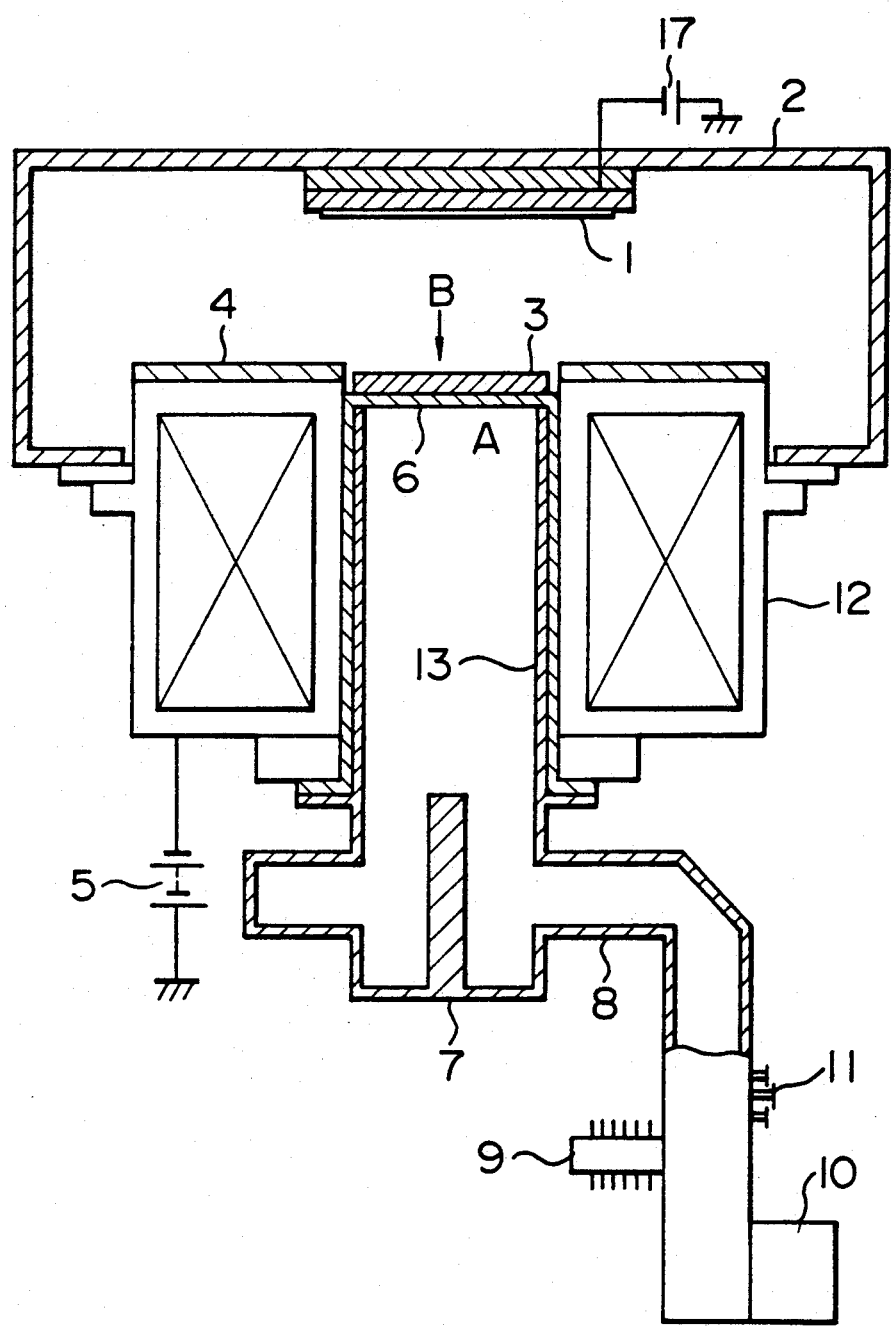
FIG. 1 is a side and partly cross-sectional view of a sputtering apparatus, which is a first embodiment of the present invention.

Hereinbelow FIG. 1 showing a bias sputtering apparatus used for forming a conductive film, which is a first embodiment of the present invention, will be explained.

As indicated in FIG. 1, the pressure in a processing chamber 2 including a substrate 1 therein is held at a predetermined value by a pumping system and a processing gas introducing system not indicated in the figure. On the rear side of a target 4 there is disposed an electromagnet 12 and the static magnetic field produced by this electromagnet encloses plasma generated by electric power of a sputtering power source 5 on the surface of the target 4. Ions in the plasma are accelerated by a high voltage of the sputtering power source 5 and collide with the target 4 to sputter target material. In this way a film is formed on the substrate 1. At the film formation a biasing power source 17 pulls-in ions in the plasma on the substrate 1 to intend to improve the quality of the film. For LSI wiring material aluminium is often used as the target material. In the present invention, as the waveguide mode in a cylindrical waveguide $TM_{01}$ mode or $TE_{11}$ mode is used. Hereinbelow, in the first embodiment, explanation will be made, supposing that $TM_{01}$ mode is used.

The microwave is transmitted from a microwave generating source 10 through an isolator 9, a matching device 11 and a rectangular waveguide 8 and converted into $TM_{01}$ mode for a circular waveguide 13 by a mode converter 7. The circular waveguide 13 introduces microwave into the processing chamber 2 while keeping the pressure in the processing chamber at a predetermined value suitable for the processing by means of a member (window material 6) made of dielectric substance (quartz, etc.) having a small loss for the microwave. The window material 6 is provided with member (shielding member 3) near to the window material 6 on the processing chamber side for shielding the surface thereof so that no film forming material is attached to the surface thereof. In this way, since no film forming material is attached to the surface of the window material 6, it is possible to feed stably the plasma with microwave electric power. By means of the supplied microwave electric power and the biasing power source, it is possible to control the quantity and the energy of ions projected to the substrate. Since the crystallinity of the film can be controlled by giving the film energy by the irradiation with ions during the formation of the film, it is possible to intend a further improvement of the quality of the film.

Figure 2:
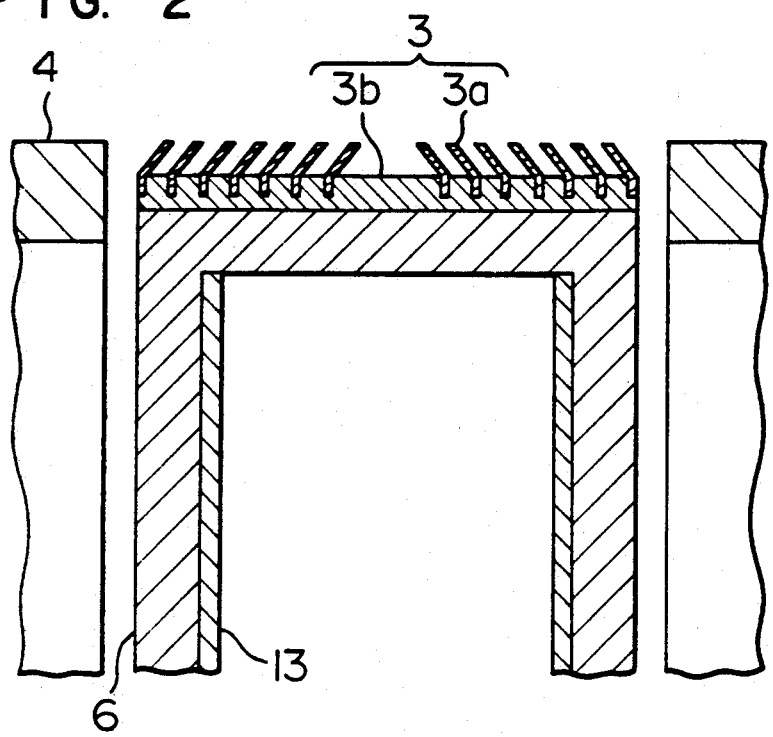
FIG. 2 is an enlarged side and partly cross-sectional view of the shielding member indicated in FIG. 1.
Figure 3:
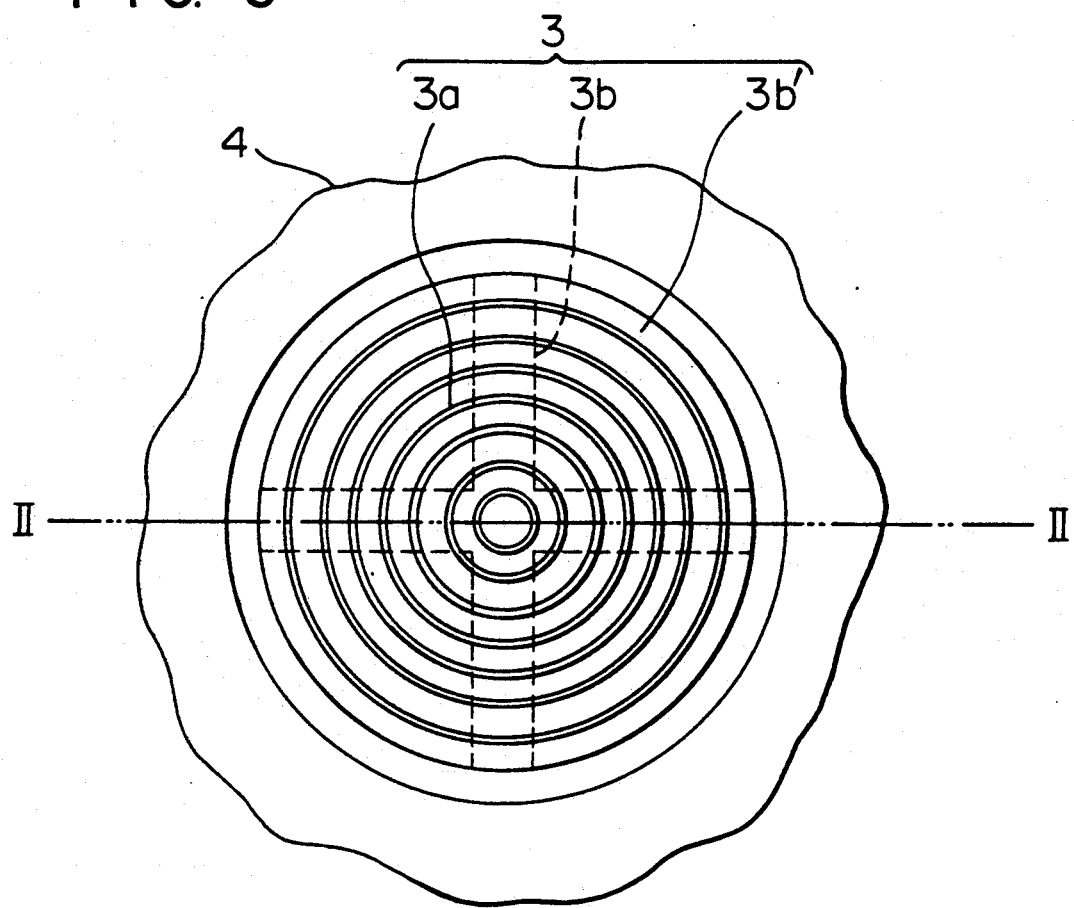
FIG. 3 is an enlarged top view of the shielding member.

FIGS. 2 and 3 show the neighborhood of the shielding member 3 in detail. FIG. 2 is an enlarged scheme showing the part A in FIG. 1 and FIG. 3 is a scheme of the part A in FIG. 1 viewed in the direction indicated by B, FIG. 2 indicating the cross section along a II—II line in FIG. 3. At $TM_{01}$ mode in the circular waveguide the electric field of the microwave is directed from the center radially towards the wall surface of the waveguide and the magnetic field is coaxial. In order to hold the electromagnetic field of $TM_{01}$ mode, the shielding member 3 is cylindrical and consists of metal plates $3a$ disposed coaxially so as to be approximately perpendicular to the electric field and a supporting plate $3b$ supporting the metal plate $3a$, in which plate 4 holes $3b'$ are formed. The extremity portion of the metal plates $3a$ is made narrower in a conical shape in order to shield the window material surface against film forming particles projected straight in an arbitrary direction.

Consequently the metal plates $3a$ shields the surface of the window material 6 against film forming particles from the target 4, most of which are projected obliquely with respect to the surface of the window material 6, to prevent the attachment of the film forming particles thereto. The interval between adjacent metal plates $3a$ is 1 to 3 mm so that no plasma is produced therebetween. The interval described above is most preferably about 2 mm. Further the interval between the shielding member 3 and the surface of the window member 6 is also 1 to 3 mm in order to prevent the production of the plasma therebetween. This interval is also most preferably about 2 mm.

In the case where the shielding member 3 undergoes sputtering, it is preferable that the shielding member 3 is made of the same material as the target 4 for the purpose of avoiding mixing of impurities in the film. However, in the case where the degree of the sputtering, which the shielding member 3 undergoes, is low, since the shielding member 3 is covered by the film forming material, it may be made not of metal, but of dielectric substance. In this case, similarly to the shielding member made of metal, it is necessary to dispose dielectric plates so that the surface thereof is perpendicular to the electric field of the microwave. Further, in order to prevent as far as possible that the shielding member 3 is sputtered, it is desirable that the shielding member 3 is at the ground potential or a floating potential.

Figure 6:
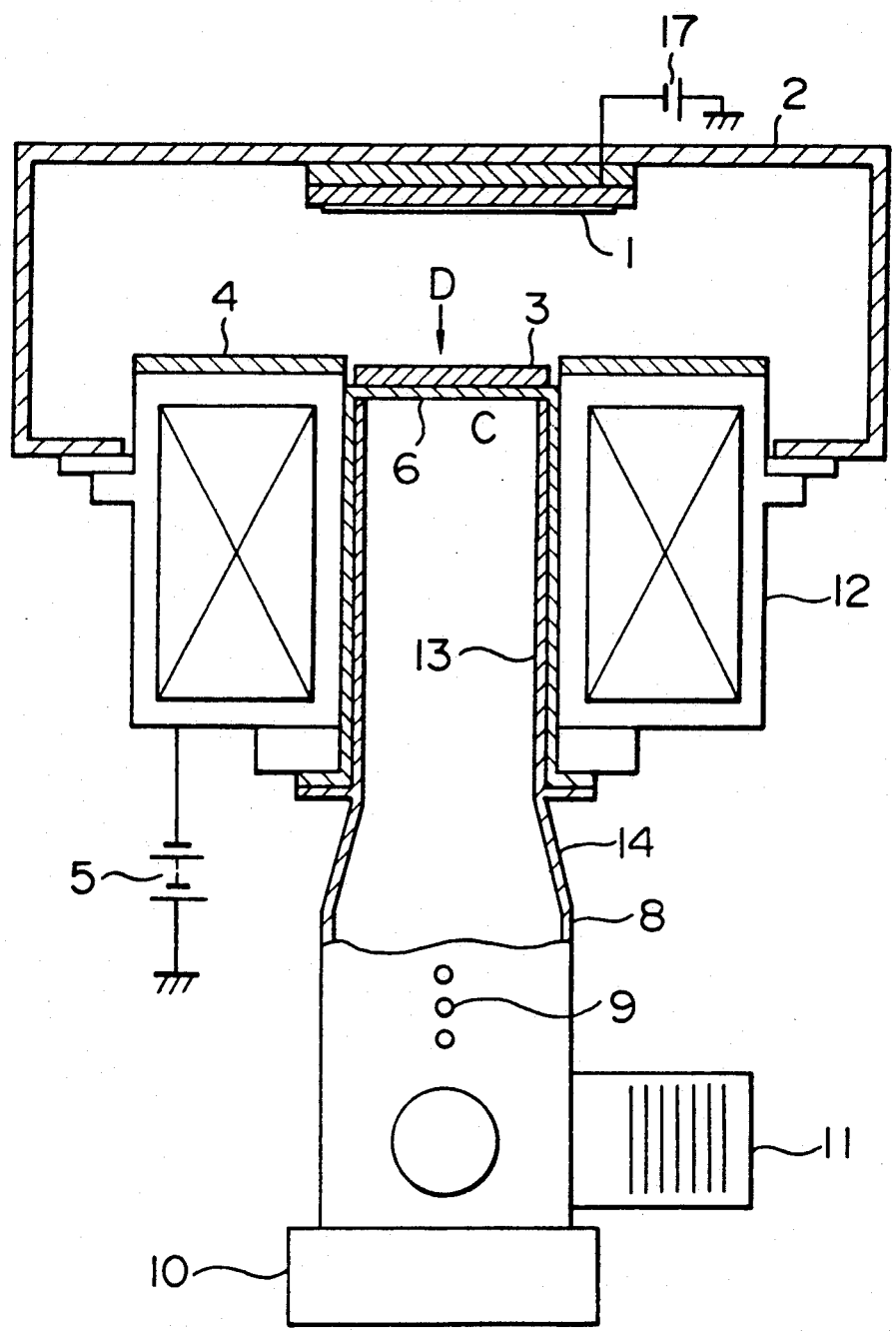
FIG. 6 is a side and partly cross-sectional view of a sputtering apparatus, which is a second embodiment of the present invention.

Next FIG. 6 showing a second embodiment of the present invention will be explained.

The second embodiment indicated in FIG. 6 has the same construction as the first embodiment indicated in FIG. 1 described previously apart from the mode of the microwave and the shielding member. FIG. 6 will be explained for the case where $TE_{11}$ mode is used as the waveguide mode of the microwave.

As indicated in FIG. 6, the microwave is transmitted from a microwave generating source 10 through an isolator 9, a matching device 11 and a rectangular waveguide tube 8 and converted into $TE_{11}$ mode for a circular waveguide by a mode converter 14. The circular waveguide 13 introduces microwave into the processing chamber while keeping the pressure in the processing chamber at a predetermined value suitable for the processing by means of a member (window material 6) made of a dielectric substance (quartz, etc.) having a small loss for the microwave. The window material 6 is provided with a member (shielding member 15) in contact with the window material 6 on the processing chamber side for shielding the surface thereof so that no film forming material is attached to the surface thereof.

Figure 7:
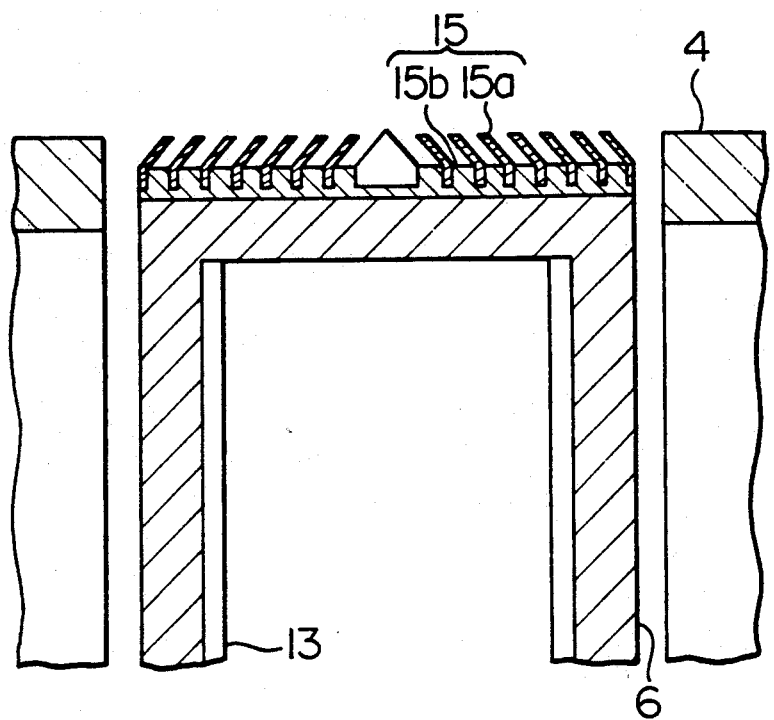
FIG. 7 is an enlarged side and partly cross-sectional view of the shielding member indicated in FIG. 6.
Figure 8:
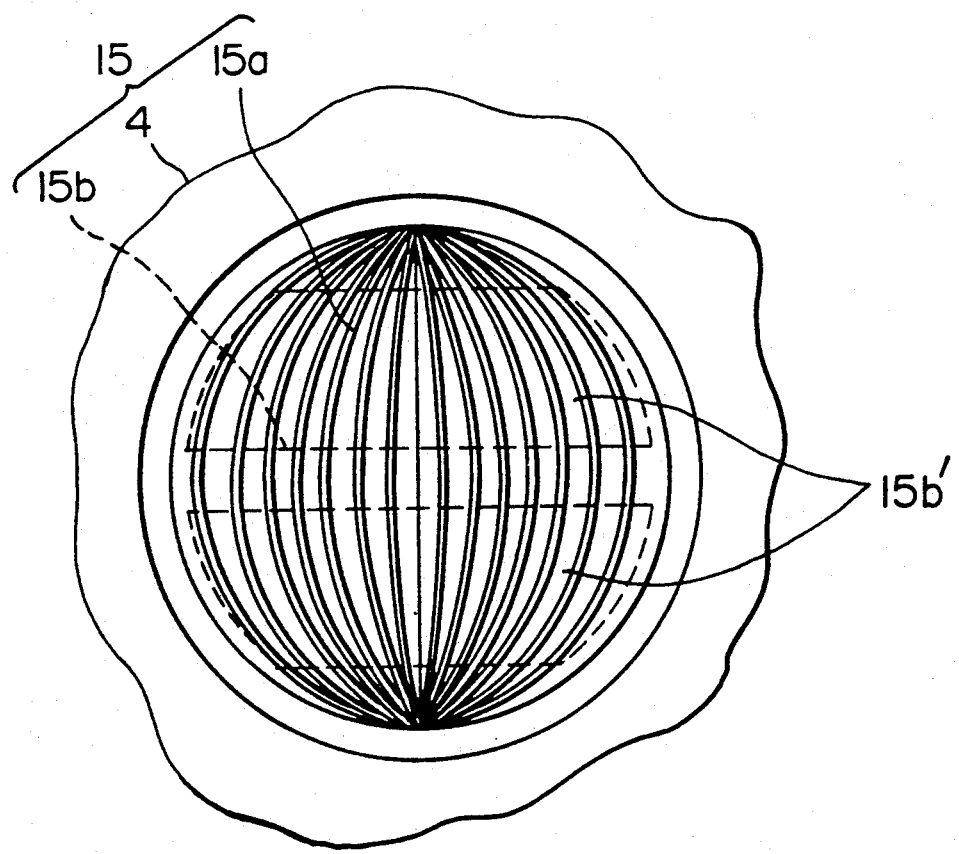
FIG. 8 is an enlarged to view of the shielding member indicated in FIG. 6.

FIGS. 7 and 8 show the neighborhood of the shielding member 15 in detail FIG. 7 is an enlarged scheme showing the part C in FIG. 6 and FIG. 8 is a scheme of the part C in FIG. 6 viewed in the direction indicated by D.

As indicated in FIGS. 7 and 8, the shielding member 15 comprises a supporting member $15b$, in which 2 half-moon-shaped holes $15b'$ opposite to each other are formed, and metal plates $15a$ secured to the supporting member $15b$, which are arc-shaped and so constructed that the extremity portion thereof is inclined at a predetermined angle with respect to the electric field before the mounting of the shielding member.

Figure 9:
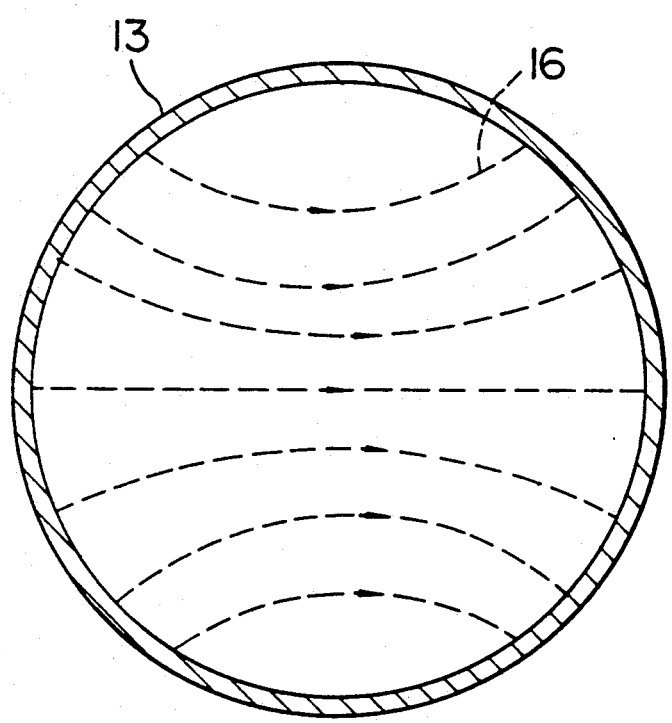
FIG. 9 indicates the electric field distribution of $TE_{11}$ mode in a cylindrical waveguide.

With respect thereto the electric field of the microwave of $TE_{11}$ mode in the circular waveguide 13 is distributed as indicated by broken lines in FIG. 9.

For this reason the electric field distribution doesn't vary, when the metal plates $15a$ are located so as to be perpendicular to the electric field distribution. Consequently it is possible to suppress the reflection of the microwave by the shielding member 15 to a low level. Further, since the extremity portion of the metal plates $15a$ of the shielding member 15 is bent inward, it is possible to hinder also film forming particles projected straight in an arbitrary direction to the window member 6. In order to prevent the generation of the plasma between adjacent metal plates $15a$ as well as the shielding member 15 and the window member 6, the interval between adjacent metal plates 15a as well as the interval between the shielding member 15 and the window member 6 are 1 to 3 mm. Particularly the intervals are most preferably about 2 mm.

In the case where the shielding member 15 undergoes sputtering, it is preferable that the shielding member 15 is made of the same material as the target 4 for the purpose of avoiding mixing of impurities in the film. However, in the case where the degree of the sputtering, which the shielding member 15 undergoes, is low, since the shielding member 15 is covered by the film forming material, it may not be made of metal, but of dielectric substance. In this case, similarly to the shielding member made of metal, it is necessary to dispose dielectric plates so that the surface thereof is perpendicular to the electric field of the microwave. Further, in order to prevent as far as possible that the shielding member 15 is sputtered, it is desirable that the shielding member 15 is at the ground potential or a floating potential.

Figure 4:
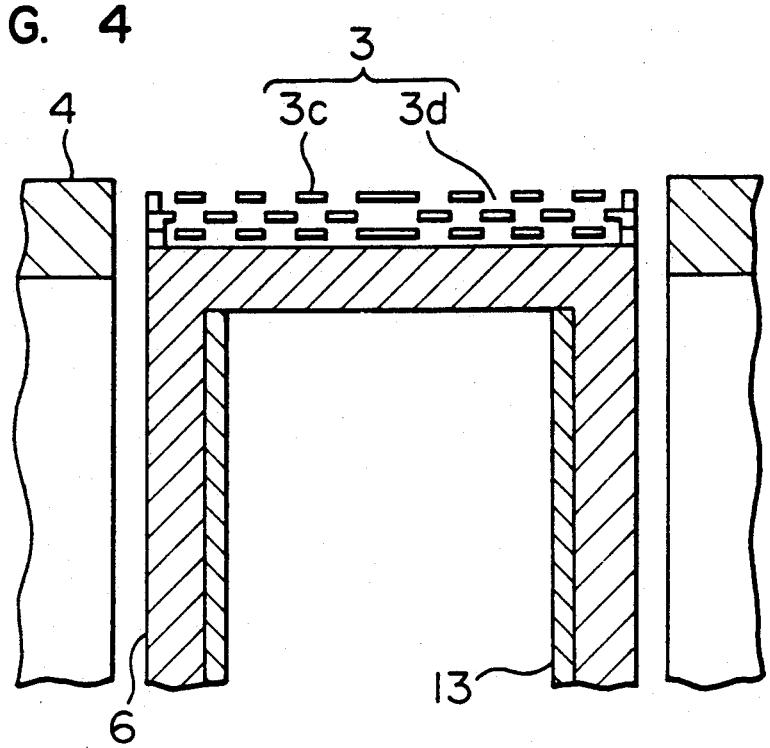
FIG. 4 is a side and partly cross-sectional view of a shielding member, which is another embodiment of the present invention.
Figure 5:
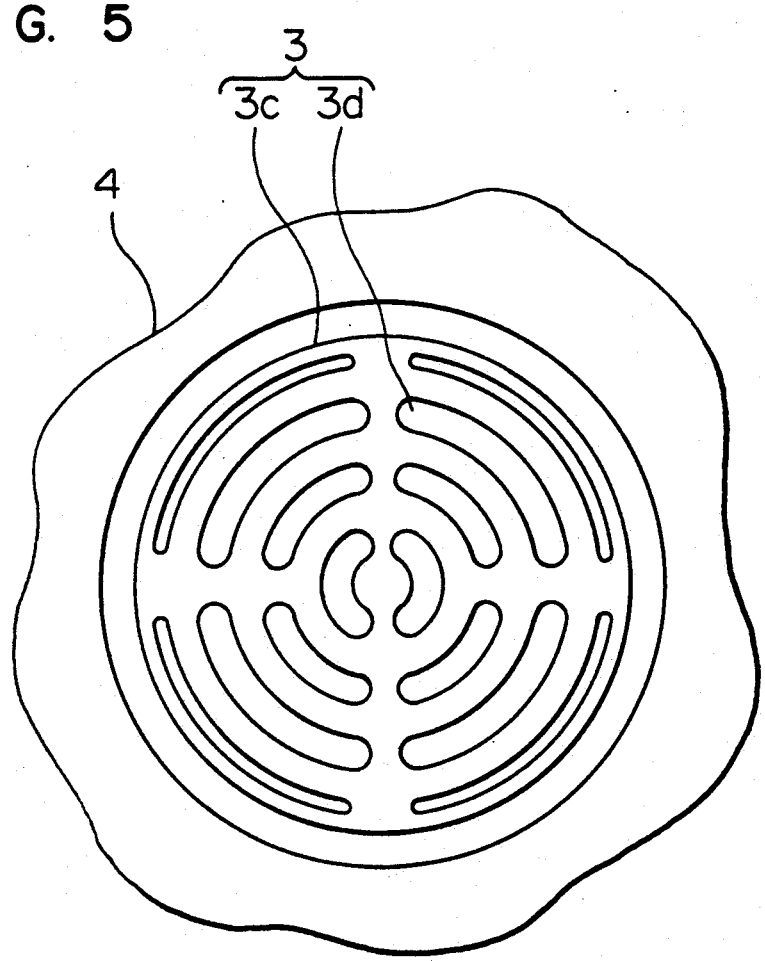
FIG. 5 is a top view of the shielding member indicated in FIG. 4.

Next a third embodiment of the present invention will be explained. Although the third embodiment is not shown in the drawings, the construction and the operation of the whole apparatus are similar to those explained, referring to FIG. 2, and what differs therefrom is that slot plates indicated in FIGS. 4 and 5 are used for the shielding member 3 and that the space between the shielding member 3 and the mode converter 7 has such a size that microwave is enclosed therein and it acts as a cavity resonator. That is, the mode converter 7 and the circular waveguide 13 constitute a reentrant cylindrical cavity resonator and the slot antenna is excited thereby.

FIGS. 4 and 5 correspond to FIGS. 2 and 3, respectively. In the $TM_{01}$ mode in the cylindrical waveguide, since the electromagnetic field has the electric field in the radial direction and the magnetic field in the peripheral direction, slots 3d are formed coaxially. The window material 6 is shielded by using three slot plates 3c having these slots 3d. The position and the numbers of the slots 3d on each of the slot plates 3d are arbitrary, if they are located in such a direction that they hinder superficial current determined by the used mode of the microwave. Further the shielding effect for the window material 6 can be improved by increasing the number and the thickness of the slot plates 3c.

Although, in the above, a sputtering apparatus has been described, the present invention can be applied also to a CVD apparatus using microwave for forming metal films. In particular, in a biased CVD apparatus, etc., since metallic material sputtered from the covered substrate by the biasing voltage is attached to the dielectric substance located at the entrance, through which microwave is introduced, the present invention is useful therefor. The present invention is useful also for a CVD apparatus, in which metal particles are separated out in the gaseous phase, because it can be prevented for the metal particles to be attached to the dielectric substance located at the entrance, through which microwave is introduced.

According to the present invention it is possible to prevent the attachment of the film forming material to the surface of the dielectric member (window material) indispensable for introducing microwave into the processing chamber. In this way it is possible to use microwave for forming a conductive film, which was difficult heretofore, and to intend to improve the quality of the film thus formed.

We claim:
1. A film forming apparatus comprising:
a microwave generating device for generating microwave;
a processing chamber having a substrate therein, holding the pressure of atmosphere gas therein at a predetermined value, and generating plasma while introducing the microwave generated by said microwave generating device for forming a film on said substrate;
a dielectric member disposed on the part of said processing chamber, through which said microwave is introduced, for holding the pressure at said predetermined value and at the same time for introducing the microwave generated in said processing chamber; and
a shielding member located in said processing chamber so as to be opposite to said dielectric member for preventing for film forming material existing in said plasma to be attached to said dielectric member without hindering the transmission of said microwave to said processing chamber;
wherein said shielding member consists of plates made of either metal or dielectric substance and disposed with an interval so as to be approximately perpendicular to the electric field of the microwave before the mounting of said shielding member.

2. A film forming apparatus comprising:
a microwave generating device for generating microwave;
a processing chamber having a substrate therein, holding the pressure of atmosphere gas therein at a predetermined value, and generating plasma while introducing the microwave generated by said microwave generating device for forming a film on said substrate;
a dielectric member disposed on the part of said processing chamber, through which said microwave is introduced, for holding the pressure at said predetermined value and at the same time for introducing the microwave generated in said processing chamber; and
a shielding member located in said processing chamber so as to be opposite to said dielectric member for preventing for film forming material existing in said plasma to be attached to said dielectric member without hindering the transmission of said microwave to said processing chamber;
wherein said shielding member consists of combinations disposed with an interval of plates made of either metal or dielectric substance and disposed so as to be inclined with a predetermined angle with respect to the electric field of the microwave before the mounting of said shielding member and plates made of either metal or dielectric substance and disposed so as to be approximately perpendicular to the electric field of the microwave before the mounting of said shielding member.

3. A film forming apparatus utilizing microwaves comprising:
a microwave generating source for generating microwaves;
a microwave guide for transmitting the microwaves generated by said microwave generating source;

a mode converter for converting a mode of the microwaves transmitted by said microwave guide;

a processing chamber for generating a plasma by the mode converted microwaves and an externally introduced processing gas for enabling forming of a film on a substrate provided therein;

a dielectric member provided on a wall of said mode converter and separating said processing chamber from said mode converter for transmitting mode converted microwaves therethrough into said processing chamber; and shielding means for shielding said dielectric member from film forming material generated by the plasma in said processing chamber so as to prevent the film forming material which imparts transmission of the mode converted microwaves to said processing chamber upon attachment to said dielectric member from being deposited on said dielectric member without impairing the transmission of the mode converted microwaves to said processing chamber, said shielding means including a shielding member provided on a processing chamber side of said dielectric member and having at least one shielding surface on which the film forming material impairing the transmission of the mode converted microwaves to said processing chamber is deposited, said shielding means including electromagnetic connection means for enabling transmission of the mode converted microwaves introduced through said dielectric member into said processing chamber without having the film forming material being deposited thereon.

4. A film forming apparatus according to claim 3, wherein said electromagnetic connection means of said shielding means includes means delimiting at least one opening.

5. A film forming apparatus according to claim 3, further comprising a target for sputtering provided on a circumference of said dielectric member, and electromagnetic means for enclosing the plasma on a surface of said target.

6. A film forming apparatus according to claim 3, wherein said shielding member includes a plurality of bent plates spaced from one another and arranged in a direction substantially perpendicular to a direction of an electric field of the mode converted microwaves transmitted through said dielectric member so that said shielding member is provided with a plurality of spaced shielding surfaces delimiting a plurality of openings.

7. A film forming apparatus according to claim 6, wherein said bent plates are one of metal and dielectric material plates.

8. A film forming apparatus according to claim 3, wherein said shielding member includes a plurality of slot plates arranged to overlap one another, each of said slot plates including a plurality of slot antennas formed thereon, and said at least one shield surface being formed by shifting of the slot antennas of said slot plates with respect to one another.

9. A film forming apparatus according to claim 8, wherein said mode converter includes a cavity resonator for resonating the microwaves transmitted by said microwave guide.

10. A film forming apparatus according to claim 9, wherein said shielding member includes a plurality of bent plates arranged in a direction substantially perpendicular to a direction of an electric field of the mode converted microwaves transmitted through said dielectric member so that said shielding member is provided with a plurality of spaced shielding surfaces delimiting a plurality of openings.

11. A film forming apparatus according to claim 10, further comprising a target for sputtering provided on a circumference of said dielectric member, and electromagnetic means for enclosing the plasma on a surface of said target.

12. A film forming apparatus according to claim 9, wherein said shielding member includes a plurality of slot plates arranged to overlap one another, each of the slot plates includes a plurality of slot antennas formed thereon, and said at least one shield surface being formed by shifting the slot antennas of said slot plates with respect to one another.

13. A film forming apparatus according to claim 12, further comprising a target for sputtering provided on a circumference of said dielectric member, and electromagnetic means for enclosing the plasma on a surface of said target.

14. A film forming apparatus according to claim 3, wherein the film formed in said processing chamber in a conductive metal film, and said shielding member includes a plurality of shielding surfaces on which the conductive metal film forming material is deposited without being deposited on said dielectric member and having a plurality of openings for enabling transmission of the mode converted microwaves introduced through said dielectric member into said processing chamber without deposit of the conductive metal film forming material thereon.

* * * * *